US012069952B2

(12) United States Patent
Kaneko et al.

(10) Patent No.: US 12,069,952 B2
(45) Date of Patent: Aug. 20, 2024

(54) THERMOELECTRIC CONVERSION MATERIAL AND THERMOELECTRIC CONVERSION DEVICE USING SAME

(71) Applicant: Panasonic Intellectual Property Management Co., Ltd., Osaka (JP)

(72) Inventors: Yuriko Kaneko, Nara (JP); Hiromasa Tamaki, Osaka (JP); Tsutomu Kanno, Kyoto (JP); Reiko Hagawa, Osaka (JP); Hiroki Sato, Shiga (JP); Hyunjeong Nam, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 426 days.

(21) Appl. No.: 17/354,935

(22) Filed: Jun. 22, 2021

(65) Prior Publication Data

US 2021/0320239 A1    Oct. 14, 2021

Related U.S. Application Data

(63) Continuation of application No. PCT/JP2019/026876, filed on Jul. 5, 2019.

(30) Foreign Application Priority Data

Mar. 26, 2019  (JP) .................. 2019-059480

(51) Int. Cl.
*H10N 10/852*  (2023.01)
*C22C 1/04*    (2023.01)
(Continued)

(52) U.S. Cl.
CPC ............. *H10N 10/852* (2023.02); *C22C 1/04* (2013.01); *C22C 12/00* (2013.01); *C22C 30/00* (2013.01)

(58) Field of Classification Search
CPC ........ H10N 10/852; C22C 12/00; C22C 30/00
See application file for complete search history.

(56) References Cited

U.S. PATENT DOCUMENTS

2017/0117453 A1\*  4/2017  Tamaki ................. C22C 1/0408
2018/0323360 A1   11/2018  Kanno et al.

FOREIGN PATENT DOCUMENTS

CN    105695774 A  \*  6/2016  .............. B22F 3/105
CN    107078201 A      8/2017
(Continued)

OTHER PUBLICATIONS

CN-105695774-A, Xin, Machine Translation (Year: 2016).\*
(Continued)

*Primary Examiner* — Devina Pillay
(74) *Attorney, Agent, or Firm* — Rimon P.C.

(57) ABSTRACT

A thermoelectric conversion material is a polycrystalline material composed of a plurality of crystal grains and has a composition represented by formula (I): $Mg_{3+m}Sb_aBi_{2-a-c}A_c$. In the formula (I), A is at least one element selected from the group consisting of Se and Te, the value of m is greater than or equal to 0.01 and less than or equal to 0.5, the value of a is greater than or equal to 0 and less than or equal to 1.0, and the value of c is greater than or equal to 0.001 and less than or equal to 0.06. The thermoelectric conversion material has an Mg-rich region.

7 Claims, 5 Drawing Sheets

(51) Int. Cl.
*C22C 12/00* (2006.01)
*C22C 30/00* (2006.01)

(56) References Cited

FOREIGN PATENT DOCUMENTS

| CN | 108097458 A | * | 6/2018 | ............... B03C 3/01 |
|---|---|---|---|---|
| CN | 108878633 A | | 11/2018 | |
| JP | 2018-190953 | | 11/2018 | |
| WO | 2017/072982 | | 5/2017 | |

OTHER PUBLICATIONS

CN-108097458-A, He, Machine Translation (Year: 2019).*
International Search Report of PCT application No. PCT/JP2019/026876 dated Sep. 10, 2019.
Jing Shuai et al., "Significant Role of Mg Stoichiometry in Designing High Thermoelectric Performance for Mg3(Sb,Bi) 2-Based n-Type Zintls", Journal of the American Chemical Society 2018, vol. 140, Jan. 14, 2018, pp. 1910-1915, S1-S3. [DOI :10.1021/jacs.7b12767].
English Translation of Chinese Search Report dated Apr. 24, 2024 for the related Chinese Patent Application No. 201980074793.2.

* cited by examiner

THERMOELECTRIC CONVERSION MATERIAL AND THERMOELECTRIC CONVERSION DEVICE USING SAME

BACKGROUND

1. Technical Field

The present disclosure relates to a thermoelectric conversion material and a thermoelectric conversion device using the same.

2. Description of the Related Art

When a temperature difference is provided between two ends of a thermoelectric conversion material, an electromotive force that is proportional to the temperature difference is generated. This phenomenon, in which heat energy is converted into electrical energy, is known as the Seebeck effect. Thermoelectric power generation technology is a technology in which heat energy is directly converted into electrical energy by using the Seebeck effect. As is well known to those skilled in the art in the technical field of thermoelectric conversion materials, the performance of a thermoelectric conversion material used in thermoelectric conversion can be evaluated by a figure of merit ZT of thermoelectric conversion. The figure of merit ZT of thermoelectric conversion is represented by formula: $ZT=S^2\sigma T/\kappa$, using the Seebeck coefficient S, the electrical conductivity $\sigma$, and the thermal conductivity $\kappa$ of the material. The higher the figure of merit ZT of thermoelectric conversion, the higher the thermoelectric conversion efficiency of the thermoelectric conversion material.

Thermoelectric conversion devices using a thermoelectric conversion material are known. The thermoelectric conversion devices make it possible to perform power generation on the basis of a temperature difference caused by an influx of heat energy.

Patent Literature 1: Japanese Patent No. 6127281, Patent Literature 2: Japanese Unexamined Patent Application Publication No. 2018-190953, and Non Patent Literature 1: J. Shuai et al., "Significant Role of Mg Stoichiometry in Designing High Thermoelectric Performance for Mg3(Sb,Bi)2-Based n-Type Zintls", J. Am. Chem. Soc. Vol. 140, pp. 1910-1915 (2018). [DOI:10.1021/jacs.7b12767], each disclose an $Mg_3(Sb,Bi)_2$-based thermoelectric conversion material.

SUMMARY

As can be understood from the formula described above regarding the figure of merit ZT of thermoelectric conversion, in a thermoelectric conversion material, as the electrical resistance increases, the thermoelectric conversion efficiency decreases. In existing thermoelectric conversion materials, depending on the environment, the electrical resistance may increase with time in some cases.

The present disclosure provides an $Mg_3(Sb,Bi)_2$-based thermoelectric conversion material in which a change in electrical resistance with time is suppressed.

In one general aspect, the techniques disclosed here feature a thermoelectric conversion material which is a polycrystalline material composed of a plurality of crystal grains, the thermoelectric conversion material having a composition represented by formula (I): $Mg_{3+m}Sb_aBi_{2-a-c}A_c$, in which, in the formula (I), A is at least one element selected from the group consisting of Se and Te, a value of m is greater than or equal to 0.01 and less than or equal to 0.5, a value of a is greater than or equal to 0 and less than or equal to 1.0, and a value of c is greater than or equal to 0.001 and less than or equal to 0.06, and in which the thermoelectric conversion material has an Mg-rich region.

According to the present disclosure, it is possible to realize an $Mg_3(Sb,Bi)_2$-based thermoelectric conversion material in which a change in electrical resistance with time is suppressed.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Incorporation by Reference

The entire contents of Japanese Patent No. 6127281 are incorporated herein by reference.

Embodiments of the Present Disclosure

Embodiments of the present disclosure will be described below with reference to the drawings.

[Thermoelectric Conversion Material]

A thermoelectric conversion material according to the present disclosure is a polycrystalline material. The polycrystalline material is composed of a plurality of crystal grains. Each of the crystal grains constituting the thermoelectric conversion material according to the present disclosure has an $La_2O_3$-type crystal structure.

The thermoelectric conversion material according to the present disclosure has a composition represented by formula (I): $Mg_{3+m}Sb_aBi_{2-a-c}A_c$. In the formula (I), A is at least one element selected from the group consisting of Se and Te. A value of m is greater than or equal to 0.01 and less than or equal to 0.5. A value of a is greater than or equal to 0 and less than or equal to 1.0. A value of c is greater than or equal to 0.001 and less than or equal to 0.06. The value of a may be greater than 0.

Figure 1:
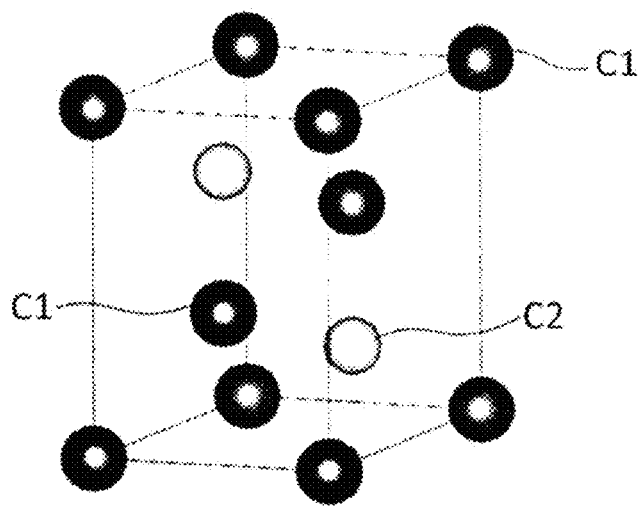
FIG. 1 is a schematic diagram showing a crystal structure of crystal grains that can constitute a thermoelectric conversion material according to the present disclosure.

FIG. 1 shows an $La_2O_3$-type crystal structure of each of the crystal grains constituting the thermoelectric conversion material according to the present disclosure. In the crystal grain constituting the thermoelectric conversion material according to the present disclosure, Mg is located at site C1 constituting the $La_2O_3$-type crystal structure, and Sb, Bi, and Te are located at site C2. Te located at site C2 may be replaced by Se within the compositional range described above.

The crystal grains constituting the thermoelectric conversion material according to the present disclosure can be observed using an enlarged observation image of a surface of the material. The surface is, for example, a cut surface of the thermoelectric conversion material. The enlarged observation image is, for example, an observation image by SEM. Before obtaining the enlarged observation image, the surface may be polished. The crystal structure of crystal grains can be confirmed by analysis based on an X-ray diffraction method.

The thermoelectric conversion material according to the present disclosure has an Mg-rich region. Some portions of the Mg-rich region are formed in boundaries of the crystal grains. The Mg-rich region can be confirmed by quantitative analysis on an enlarged observation image of the surface of the material, e.g., an SEM observation image. The quantitative analysis can be performed, for example, by EDS combined with SEM (SEM/EDS). An example of a specific technique for confirming the Mg-rich region by SEM/EDS is as follows.

An enlarged observation image of a surface to be evaluated in the thermoelectric conversion material is obtained by SEM. Then, quantitative analysis by EDS is performed on the enlarged observation image, by selecting the elements Mg, Sb. Bi, C, and O. Te, whose content is extremely low, can be excluded from the selection. Furthermore, C and O may adhere to the surface as impurities in some cases, and therefore may be added to the selection. Next, the three elements Mg, Sb, and Bi are mapped to intensities according to the atomic percentages of the individual elements evaluated by the quantitative analysis, and an image is displayed. A different color is assigned to each element. The colors to be assigned are, for example, red (R) to Mg, green (G) to Sb, and blue (B) to Bi. Then, a threshold is set for the purity of the color assigned to Mg, and a region with a purity that is greater than or equal to the threshold in the mapping image is displayed with emphasis. The mapping image may be converted into and displayed as a black and white binarized image in which white is assigned only to the region with a purity that is greater than or equal to the threshold. As the region with a purity that is greater than or equal to the threshold in the mapping image, an Mg-rich region rich in Mg can be specified.

Figure 2:
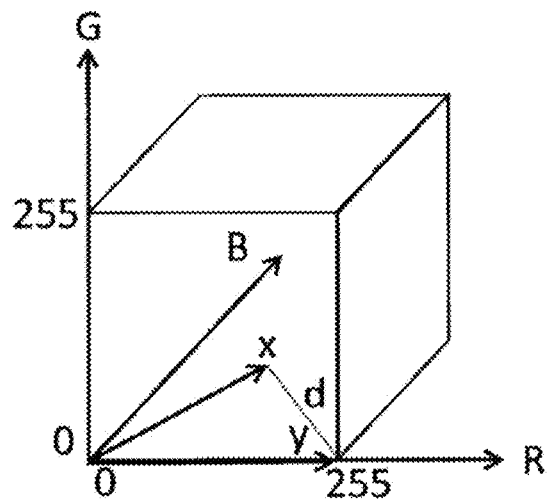
FIG. 2 is a schematic diagram for illustrating a distance d between two points in an RGB color space.

A threshold for the purity of color, for example, can be set as follows. In the mapping image in which red is assigned to Mg, green is assigned to Sb, and blue is assigned to Bi, ideal RGB values of a region composed of only Mg are set to be (R,G,B)=(255,0,0). Note that each of RGB values has 256 gradations. As shown in FIG. 2, in an RGB color space (i.e., color map), given x is a vector connecting a point with arbitrary RGB components to the origin, and y is a vector connecting a point with components (R,G,B)=(255,0,0) to the origin, a distance d between the two points in the color space is obtained from formula (1) below.

$$d = \sqrt{\sum_i (x_i - y_i)^2} \quad (1)$$

By using the distance d, the relative concentration C of Mg compared with Sb and Bi can be defined by formula (2) below. According to the formula (2), the relative concentration C of Mg can be expressed in a range of 0 to 255. Regarding the relative concentration C of Mg, for example, 130 can be set as a threshold.

$$C = \begin{cases} 255 - d & \text{if } d < 255 \\ 0 & \text{else} \end{cases} \quad (2)$$

The enlarged observation image should be an image which includes at least 10 crystal grains. When the area of the entire image is more than or equal to 600 $\mu m^2$, the image usually includes at least 10 crystal grains.

The degree of formation of the Mg-rich region can be evaluated by a ratio of the total area of the Mg-rich region shown in the enlarged observation image to the area of the entire enlarged observation image. Hereinafter, the ratio is described as an "Mg precipitation ratio". The Mg precipitation ratio can be obtained from the mapping image in which a region with a purity that is greater than or equal to the threshold for Mg is displayed with emphasis. The Mg precipitation ratio is, for example, more than or equal to 1%. The upper limit of the Mg precipitation ratio is, for example, less than or equal to 20%, and may be less than or equal to 8%, or less than or equal to 6%. The Mg precipitation ratio, typically, is a value when the threshold for the purity of color is set by the method described above and the threshold based on the relative concentration C of Mg is set to be 130.

Hitherto, it has been considered that, when the compositional ratio of Sb is low in an $Mg_3(Sb,Bi)_2$-based thermoelectric conversion material, the properties including electrical resistance of the material are likely to change. However, in the thermoelectric conversion material according to the present disclosure, for example, even at high temperatures in vacuum, a change in electrical resistance with time can be suppressed. The change is usually an increase. In the thermoelectric conversion material according to the present disclosure, the resistance change rate, which is obtained by formula: $|(R_1-R_0)/R_0|\times 100(\%)$, where $R_0$ is the electrical resistance before performing a heat resistance test in which the material is left to stand in vacuum at 450° C. for 6 hours, and $R_1$ is the electrical resistance after the test, is, for example, less than or equal to 250%, and may be less than or equal to 100%, less than or equal to 75%, less than or equal to 50%, less than or equal to 30%, or less than or equal to 20%.

The thermoelectric conversion material according to the present disclosure is usually of n-type. As is well known to those skilled in the art in the technical field of thermoelectric conversion materials, an n-type thermoelectric conversion material has a negative Seebeck coefficient S.

The application of the thermoelectric conversion material according to the present disclosure is not limited. For example, the thermoelectric conversion material can be used for thermoelectric conversion devices.

(Production Method)

An example of a method for producing a thermoelectric conversion material according to the present disclosure will be shown below.

Mg powder, Sb powder, Bi powder, and Te powder serving as starting materials are introduced into a milling container and subjected to mechanical milling. The milling atmosphere is an inert gas atmosphere. The atmosphere can suppress the oxidation of the starting materials. The inert gas is, for example, argon and/or helium. Powder of a precursor alloy of MgSbBiTe is obtained by this process. Next, the resulting precursor alloy is subjected to sintering to obtain a polycrystalline material of MgSbBiTe. For example, a spark plasma sintering method can be used for sintering. The resulting polycrystalline material may be directly used as a thermoelectric conversion material. Furthermore, heat treatment may be performed on the resulting polycrystalline material. In this case, the heat-treated polycrystalline material can be used as a thermoelectric conversion material. During sintering by the spark plasma method, usually, in order to prevent an electric current from being applied to a precursor alloy to be subjected to sintering, insulation is maintained on the precursor alloy. The insulation can be maintained, for example, by placing an insulating material between a die (sintering die) used in the spark plasma method and the precursor alloy.

[Thermoelectric Conversion Device]

Figure 3:
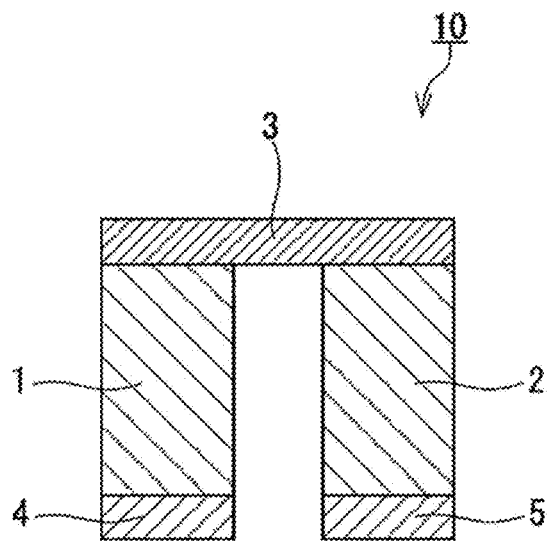
FIG. 3 is a schematic diagram showing an example of a thermoelectric conversion device according to the present disclosure.

An example of a thermoelectric conversion device according to the present disclosure is shown in FIG. 3. A thermoelectric conversion device 10 shown in FIG. 3 includes a p-type thermoelectric conversion section 1, an n-type thermoelectric conversion section 2, a first electrode 3, a second electrode 4, and a third electrode 5. One end of the p-type thermoelectric conversion section 1 and one end of the n-type thermoelectric conversion section 2 are electrically connected to each other via the first electrode 3. Another end of the p-type thermoelectric conversion section 1 is electrically connected to the second electrode 4. Another end of the n-type thermoelectric conversion section 2 is electrically connected to the third electrode 5. The n-type thermoelectric conversion section 2 is formed of a thermoelectric conversion material according to the present disclosure. In the thermoelectric conversion device 10, a change in electrical resistance with time in the n-type thermoelectric conversion section 2 is suppressed. Thus, it is possible to achieve a thermoelectric conversion device 10 which has high stability with time in properties, such as power generation amount.

Figure 4:
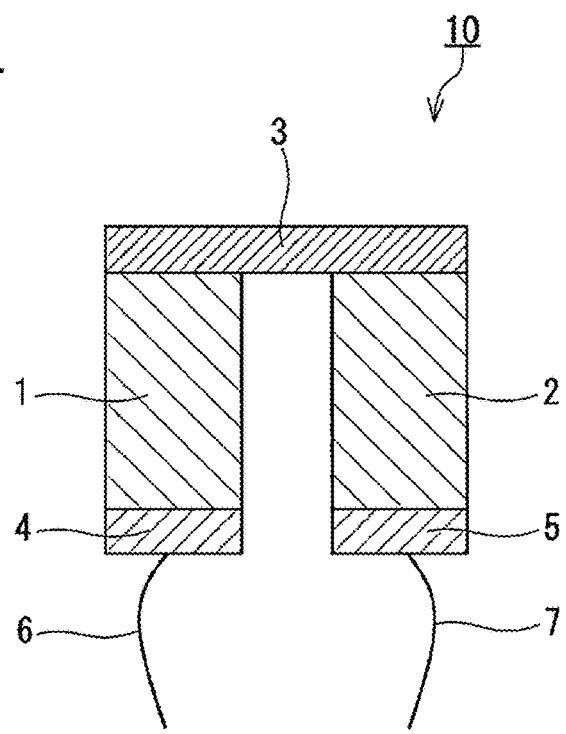
FIG. 4 is a schematic diagram showing an example of the use state of the thermoelectric conversion device shown in FIG. 3.

An example of the use of the thermoelectric conversion device 10 is shown in FIG. 4. Referring to FIG. 4, a first wire 6 is electrically connected to the second electrode 4 of the thermoelectric conversion device 10, and a second wire 7 is electrically connected to the third electrode 5. The first wire 6 and the second wire 7 have a function of extracting the electric power generated in the thermoelectric conversion device 10.

The thermoelectric conversion device 10 can be manufactured by a known method.

The application of the thermoelectric conversion device according to the present disclosure is not limited. The thermoelectric conversion device according to the present disclosure can be used in various applications, including, for example, in the applications of existing thermoelectric conversion devices.

EXAMPLES

The thermoelectric conversion material according to the present disclosure will be described more in detail below with reference to Examples. However, the thermoelectric conversion material according to the present disclosure is not limited to the embodiments shown in the following Examples.

Example 1

(Production of Precursor Alloy of MgSbBiTe)

As starting materials, 1.4008 g of Mg powder, 1.3798 g of Sb powder, 5.4863 g of Bi powder, and 0.0240 g of Te powder were weighed in a glove box. The inside of the glove box was controlled in an argon atmosphere during at least from weighing of the starting materials to obtaining of a thermoelectric conversion material. Then, in the glove box, the weighed powders, together with two stainless steel balls (diameter: 12.7 mm) and one stainless steel ball (diameter: 6.35 mm), were introduced into a ball milling container. The ball milling container was made of stainless steel and had an internal volume of 65 mL. Then, an opening of the ball milling container was sealed in the glove box.

Next, the ball milling container was taken out of the glove box and installed in a ball mill. As the ball mill, a SPEX8000D manufactured by SPEX Corp. was selected. By operating the ball mill, pulverization treatment was performed for 2 hours. Powder of a precursor alloy of MgSbBiTe was produced by the pulverization treatment.

(Sintering)

Next, the ball milling container was moved into the glove box. In the glove box, powder was taken out of the ball milling container. About 2.5 g of powder taken out was compacted into a cylinder with a diameter of 10 mm. In the glove box, the cylinder was accommodated into a sintering space of a die (sintering die) made of carbon. The sintering space of the die had a cylindrical shape with a diameter of 15 mm. The cylinder was accommodated while filling a gap between the surface of the cylinder and the surface of the sintering space with insulating powder. By filling with the insulating powder, insulation on the cylinder during sintering was maintained. As the insulating powder, powder having heat resistance to the sintering temperature was selected.

Next, the die was accommodated into a chamber of a spark plasma sintering apparatus. The chamber was controlled in an argon atmosphere. Next, while applying a pressure of 45 MPa to the cylinder and the powder accommodated in the die, an electric current was applied to the die by the sintering apparatus. By the application of the electric current, after the temperature of the die reached 800° C., i.e., the sintering temperature, the temperature was held for 15 minutes. Then, by gradually decreasing the electric current, heating of the die was stopped. After the temperature of the die was decreased to room temperature, a sintered body was taken out of the die. By polishing the surface of the sintered body, the insulating powder was removed from the sintered body. In this way, a thermoelectric conversion material of Example 1 was obtained.

Example 2

(Production of Precursor Alloy of MgSbBiTe)

As starting materials, 2.0000 g of Mg powder, 1.4734 g of Sb powder, 7.5361 g of Bi powder, and 0.0309 g of Te powder were weighed in a glove box. The inside of the glove box was controlled in an argon atmosphere during at least from weighing of the starting materials to obtaining of a thermoelectric conversion material. Then, in the glove box, the weighed powders, together with 30 stainless steel balls (diameter: 10 mm), were introduced into a ball milling container. The ball milling container was made of stainless steel and had an internal volume of 80 mL. Then, an opening of the ball milling container was sealed in the glove box.

Next, the ball milling container was taken out of the glove box and installed in a planetary ball mill. As the planetary ball mill, a Pulverisette6 manufactured by FRITSCH was selected. By operating the planetary ball mill, pulverization treatment was performed for 4 hours under a condition of a rotational speed of 400 rpm. Powder of a precursor alloy of MgSbBiTe was produced by the pulverization treatment.
(Sintering)

Next, the ball milling container was moved into the glove box. In the glove box, powder was taken out of the ball milling container. About 2 g of powder taken out was filled into a sintering space of a die made of carbon in the glove box. The sintering space of the die had a cylindrical shape with a diameter of 10 mm. The powder was accommodated while filling a gap between the powder and the surface of the sintering apparatus with insulating powder. By filling with the insulating powder, insulation on the precursor alloy during sintering was maintained. As the insulating powder, powder having heat resistance to the sintering temperature was selected.

Next, the die was accommodated into a chamber of a spark plasma sintering apparatus. The chamber was controlled in an argon atmosphere. Next, while applying a pressure of 50 MPa to the powder accommodated in the die, an electric current was applied to the die by the sintering apparatus. By the application of the electric current, after the temperature of the die reached 750° C., i.e., the sintering temperature, the temperature was held for 5 minutes. Then, by decreasing the electric current, the temperature of the die was decreased to 600° C., and this temperature was held for 30 minutes. Next, by stopping the electric current, heating of the die was stopped. After the temperature of the die was decreased to room temperature, a sintered body was taken out of the die. By polishing the surface of the sintered body, the insulating powder was removed from the sintered body. In this way, a thermoelectric conversion material of Example 2 was obtained.

Example 3

(Production of Precursor Alloy of MgSbBiTe)

A precursor alloy of MgSbBiTe was produced as in Example 1 except that 1.5700 g of Mg powder, 2.2474 g of Sb powder, 3.8184 g of Bi powder, and 0.0024 g of Te powder were used as starting materials.
(Sintering)

A thermoelectric conversion material of Example 3 was obtained as in Example 2 except that the sintering temperature was changed to 600° C.; after the die was held at the sintering temperature for 5 minutes, by stopping the electric current, heating of the die was stopped; and the temperature was not held at 600° C. for 30 minutes.

Example 4

(Production of Precursor Alloy of MgBiTe)

A precursor alloy of MgBiTe was produced as in Example 1 except that 1.3000 g of Mg powder, 6.1953 g of Bi powder, and 0.1169 g of Te powder were used as starting materials.
(Sintering)

A thermoelectric conversion material of Example 4 was obtained as in Example 2 except that the sintering temperature was changed to 550° C.; after the die was held at the sintering temperature for 5 minutes, by stopping the electric current, heating of the die was stopped; and the temperature was not held at 600° C. for 30 minutes.

Example 5

(Production of Precursor Alloy of MgSbBiTe)

A precursor alloy of MgSbBiTe was produced as in Example 2 except that 2.0000 g of Mg powder, 1.8786 g of Sb powder, 7.5235 g of Bi powder, and 0.0328 g of Te powder were used as starting materials.
(Sintering)

A thermoelectric conversion material of Example 5 was produced as in Example 2 except that the sintering temperature was changed to 800° C.; the holding time at the sintering temperature was changed to 15 minutes; after the die was held at the sintering temperature, by stopping the electric current, heating of the die was stopped; and the temperature was not held at 600° C. for 30 minutes.
(Evaluation of Compositional Ratio)

The composition of each of the thermoelectric conversion materials produced was evaluated by an inductively coupled plasma (ICP) emission spectrochemical analysis method. The evaluation results are shown in Table 1 below. As shown in Table 1, the composition of each thermoelectric conversion material was substantially the same as the feed composition of the starting materials.

TABLE 1

| | Feed composition (molar ratio) | Composition of thermoelectric conversion material |
|---|---|---|
| Example 1 | $Mg_{3.05}Sb_{0.6}Bi_{1.39}Te_{0.01}$ | $Mg_{3.05}Sb_{0.61}Bi_{1.38}Te_{0.011}$ |
| Example 2 | $Mg_{3.4}Sb_{0.5}Bi_{1.49}Te_{0.01}$ | $Mg_{3.39}Sb_{0.5}Bi_{1.50}Te_{0.010}$ |
| Example 3 | $Mg_{3.5}Sb_{1.0}Bi_{0.999}Te_{0.001}$ | $Mg_{3.49}Sb_{1.0}Bi_{0.999}Te_{0.001}$ |
| Example 4 | $Mg_{3.5}Bi_{1.94}Te_{0.06}$ | $Mg_{3.48}Bi_{1.95}Te_{0.055}$ |
| Example 5 | $Mg_{3.2}Sb_{0.6}Bi_{1.4}Te_{0.01}$ | $Mg_{3.19}Sb_{0.59}Bi_{1.41}Te_{0.009}$ |

(Analysis of Crystal Structure)

The crystal structure of each of the thermoelectric conversion materials produced was analyzed by an X-ray diffraction method. In the X-ray diffraction measurement, CuKα radiation was used. The lattice constant of the crystal structure confirmed is shown in Table 2.

TABLE 2

| | a (Å) | b (Å) | c (Å) |
|---|---|---|---|
| Example 1 | 4.6281 | 4.6281 | 7.3443 |
| Example 2 | 4.6369 | 4.6369 | 7.3567 |
| Example 3 | 4.6132 | 4.6132 | 7.3202 |
| Example 4 | 4.6607 | 4.6607 | 7.3996 |
| Example 5 | 4.6281 | 4.6281 | 7.3461 |

Figure 5:
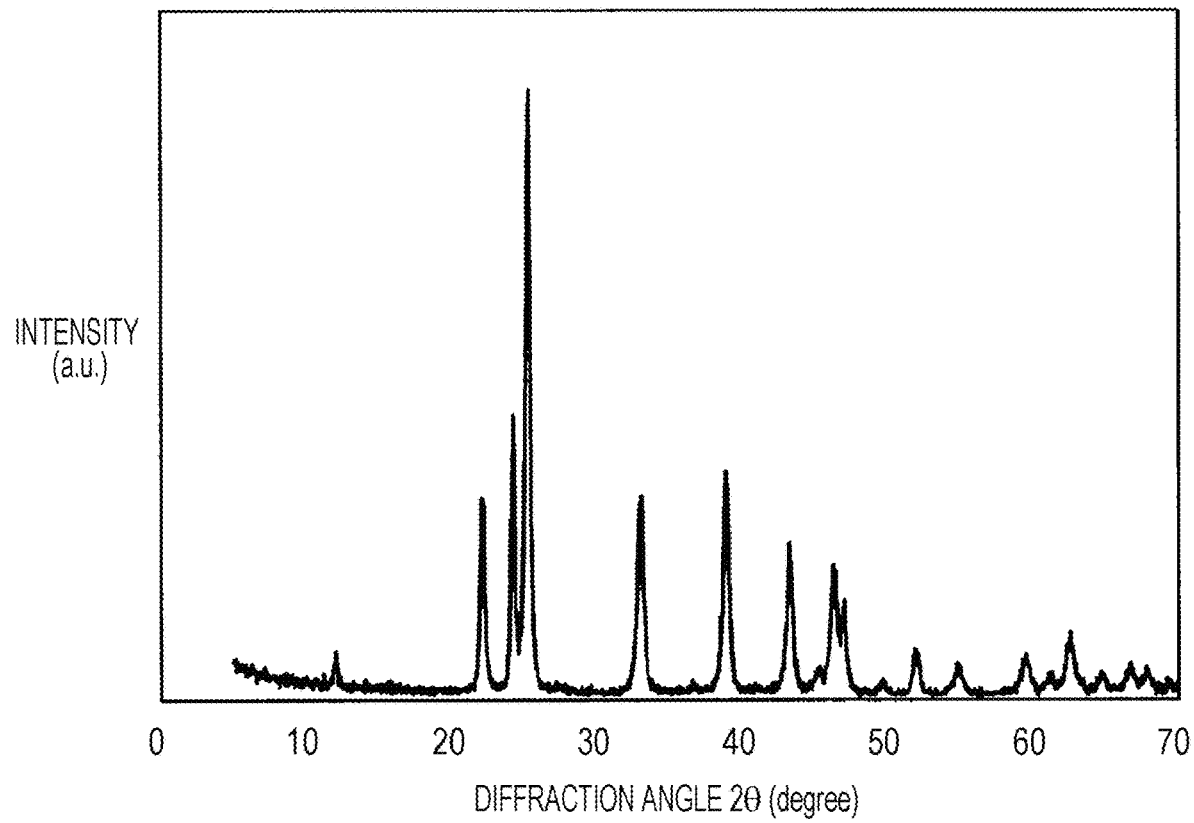
FIG. 5 is a graph showing an X-ray diffraction profile of a thermoelectric conversion material produced in Example 1.
Figure 6:
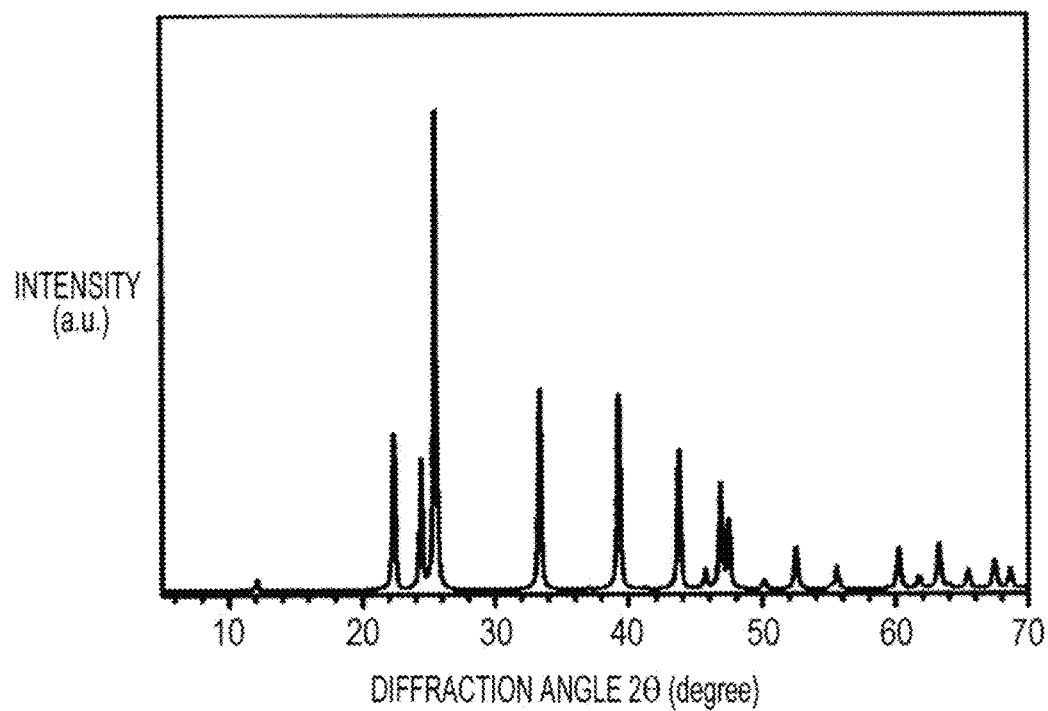
FIG. 6 is a graph showing an X-ray diffraction profile obtained by a simulation on an $La_2O_3$-type crystal structure having the same composition as that of the thermoelectric conversion material produced in Example 1.

FIG. 5 shows an X-ray diffraction profile of the thermoelectric conversion material of Example 1. Furthermore, FIG. 6 shows an X-ray diffraction profile obtained by a simulation on an $La_2O_3$-type crystal structure having the same composition as that of the thermoelectric conversion material of Example 1. The profile shown in FIG. 5 substantially corresponded to the profile shown in FIG. 6. From this, it was confirmed that the thermoelectric conversion material of Example 1 had an $La_2O_3$-type crystal structure. Similarly, it was confirmed that the thermoelectric conversion materials of Examples 2 to 5 also had an $La_2O_3$-type crystal structure.

(Calculation of Seebeck Coefficient)

The Seebeck coefficient S of each of the thermoelectric conversion materials produced is shown in Table 3 below. Regarding the details of the calculation method of the Seebeck coefficient S, refer to U.S. patent application Ser. No. 14/847,321 (International Application No. PCT/JP2014/001882), U.S. patent application Ser. No. 14/847,362 (International Application No. PCT/JP2014/001883), and U.S. patent application Ser. No. 14/718,491 (International Application No. PCT/JP2014/001885). All of these three patent applications are incorporated herein by reference. As shown in Table 3, each of the thermoelectric conversion materials produced was of n-type.

TABLE 3

| | Seebeck coefficient ($\mu V/K$) |
|---|---|
| Example 1 | −142 |
| Example 2 | −142 |
| Example 3 | −39 |
| Example 4 | −67 |
| Example 5 | −162 |

(Observation of Microstructure)

Figure 7:
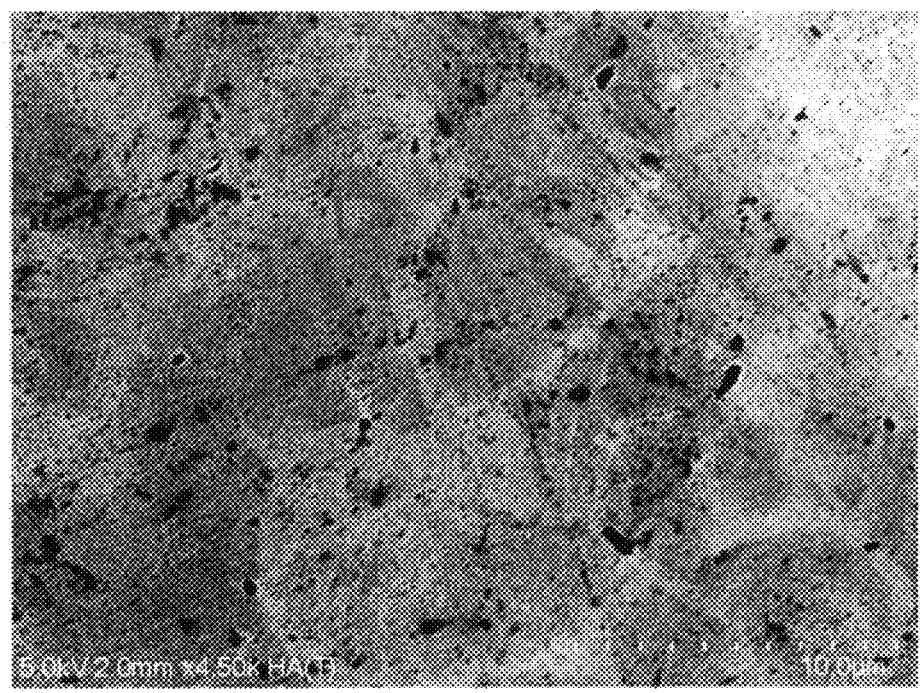
FIG. 7 shows an observation image by a scanning electron microscope (SEM) on a surface of the thermoelectric conversion material produced in Example 1.

By observing a surface by SEM, it was confirmed that each of the thermoelectric conversion materials produced was a polycrystalline material composed of a plurality of crystal grains. FIG. 7 shows an enlarged observation image by SEM on a surface of the thermoelectric conversion material of Example 1. Note that the observation image shown in FIG. 7 is a reflection electron image. Before performing SEM observation, the surface of an object to be evaluated was polished with abrasive paper and an argon beam. A structure in which grains are isolated by grain boundaries is shown in FIG. 7.

(Quantitative Analysis)

Figure 8:
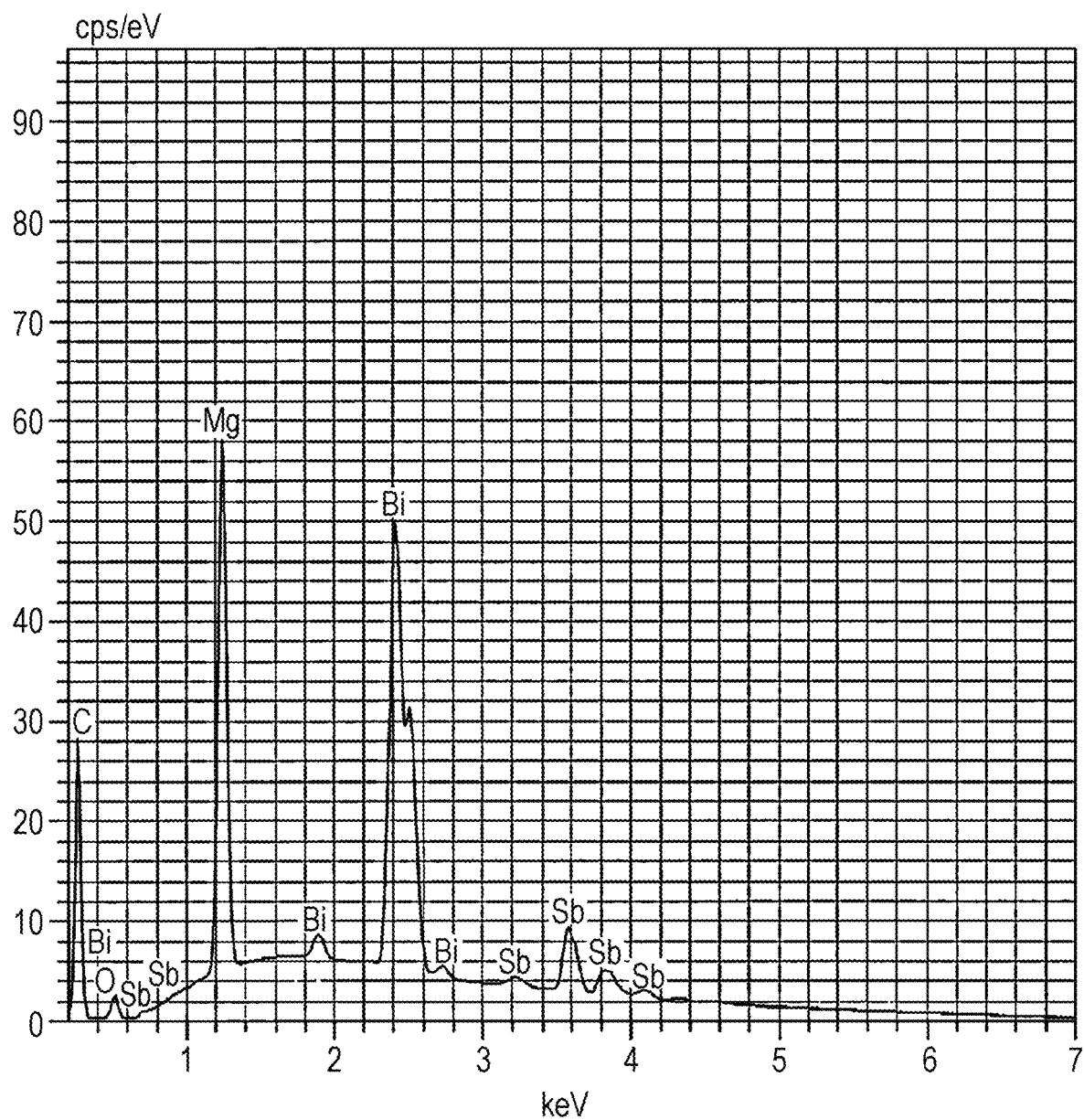
FIG. 8 is a graph showing an energy dispersive X-ray spectroscopy (EDS) spectrum on the thermoelectric conversion material produced in Example 1.
Figure 9:
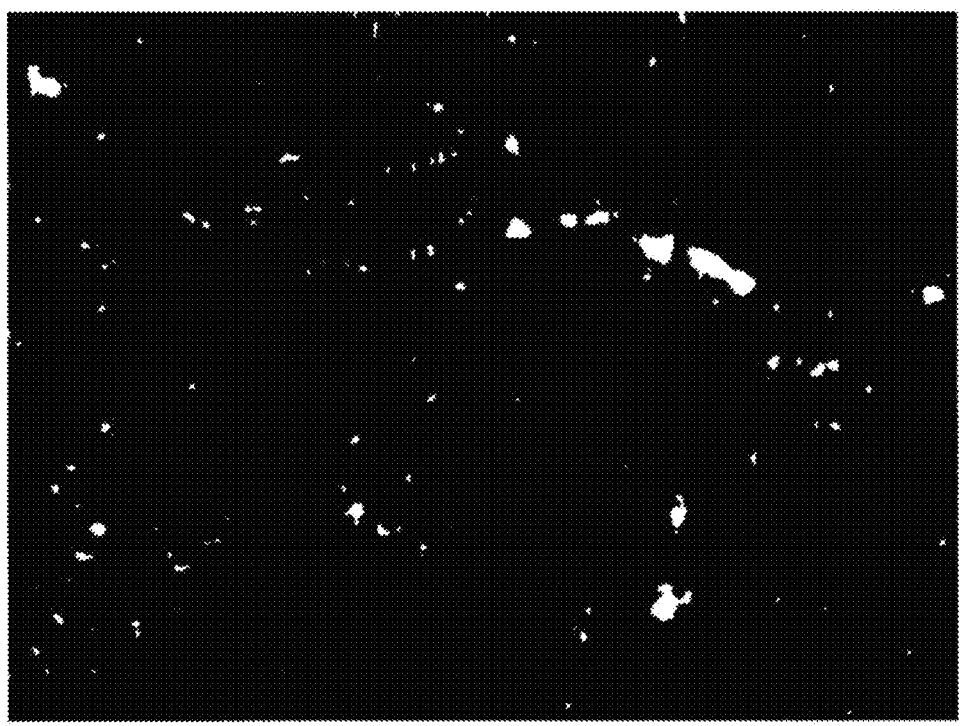
FIG. 9 shows a binarized image of an image obtained by quantitative analysis on a surface of the thermoelectric conversion material produced in Example 1.

The quantitative analysis by SEM/XDS, which was described above, was performed on the thermoelectric conversion materials produced. As the enlarged observation image used in the quantitative analysis, an image which included more than or equal to 10 crystal grains and whose short side was more than or equal to 25 $\mu m$ was selected. A ZAF correction was used in the quantitative analysis by XDS. FIG. 8 shows an XDS spectrum of the thermoelectric conversion material of Example 1. As for the colors assigned to the mapping image, red was assigned to Mg, green was assigned to Sb, and blue was assigned to Bi. The threshold for the purity of the color assigned to Mg was set by the method described above. The threshold based on the relative concentration C of Mg was set to be 130. On the mapping image, a region in which the threshold was greater than or equal to 130 was displayed with emphasis by red, the color assigned to Mg. Next, the resulting mapping image was converted into a black and white binarized image in which white was assigned only to the region with an Mg purity that was greater than or equal to the threshold. FIG. 9 shows a binarized image obtained by the quantitative analysis of the thermoelectric conversion material of Example 1. As shown in FIG. 9, some portions of the Mg-rich region were formed in boundaries between crystal grains of the thermoelectric conversion material. Regarding the thermoelectric conversion material of Example 1, the Mg precipitation ratio obtained from the binarized image was 1.44% (=11 $\mu m^2$/762 $\mu m^2 \times 100\%$). The evaluation results of the quantitative analysis on each of the thermoelectric conversion materials produced are shown in Table 4 below.

TABLE 4

| | Entire area ($\mu m^2$) | Total area of Mg-rich region ($\mu m^2$) | Mg precipitation ratio (%) |
|---|---|---|---|
| Example 1 | 762 | 11 | 1.44 |
| Example 2 | 1276 | 69 | 5.41 |
| Example 3 | 625 | 125 | 20.00 |
| Example 4 | 11842 | 893 | 7.54 |
| Example 5 | 625 | 2 | 0.32 |

(Evaluation of Electrical Resistance and Change Rate)

The electrical resistance $R_0$ of each of the thermoelectric conversion materials produced was measured by a 4-terminal method. Next, each of the thermoelectric conversion materials was held in vacuum at 450° C. for 6 hours, followed by cooling to room temperature, and the electrical resistance $R_1$ was measured again by the 4-terminal method. The resistance change rate, represented by formula: $|(R_1-R_0)/R_0|\times100(\%)$, of each of the thermoelectric conversion materials, together with the electrical resistances $R_0$ and $R_1$, is shown in Table 5 below.

TABLE 5

| | Electrical resistance ($\mu\Omega$) | | Resistance change rate (%) |
|---|---|---|---|
| | $R_0$ | $R_1$ | |
| Example 1 | 14.4 | 17.2 | 20 |
| Example 2 | 11.5 | 13.7 | 19 |
| Example 3 | 6.2 | 8.1 | 30 |
| Example 4 | 7.2 | 12.5 | 74 |
| Example 5 | 13.4 | 46.2 | 245 |

As shown in Tables 4 and 5, in the thermoelectric conversion materials of Examples 1 to 4 having an Mg precipitation ratio of more than or equal to 1%, the resistance change rate was particularly decreased.

The thermoelectric conversion material according to the present disclosure can be used in various applications, including in the applications of existing thermoelectric conversion materials.

What is claimed is:

1. A thermoelectric conversion material which is a polycrystalline material composed of a plurality of crystal grains, the thermoelectric conversion material comprising a composition represented by formula (I): $Mg_{3+m}Sb_aBi_{2-a-c}A_c$, wherein, in the formula (I), A is at least one element selected from the group consisting of Se and Te;

a value of m is greater than 0.42 and less than or equal to 0.5;

a value of a is greater than 0 and less than or equal to 1.0; and a value of c is greater than or equal to 0.001 and less than or equal to 0.06, wherein the thermoelectric conversion material has an Mg-rich region.

2. The thermoelectric conversion material according to claim 1, wherein each of the crystal grains has an $La_2O_3$-type crystal structure.

3. The thermoelectric conversion material according to claim 1, wherein the Mg-rich region is formed in boundaries of the crystal grains.

4. A thermoelectric conversion device comprising:
a p-type thermoelectric conversion section;
an n-type thermoelectric conversion section;
a first electrode;
a second electrode; and
a third electrode,
wherein one end of the p-type thermoelectric conversion section and one end of the n-type thermoelectric conversion section are electrically connected to each other via the first electrode,
another end of the p-type thermoelectric conversion section is electrically connected to the second electrode,
another end of the n-type thermoelectric conversion section is electrically connected to the third electrode, and
the n-type thermoelectric conversion section is formed of the thermoelectric conversion material according to claim 1.

5. The thermoelectric conversion material according to claim 1, wherein the thermoelectric conversion material has an Mg precipitation ratio of more than or equal to 1%.

6. The thermoelectric conversion material according to claim 5, wherein the Mg precipitation ratio is less than or equal to 20%.

7. The thermoelectric conversion material according to claim 5, wherein the Mg precipitation ratio is less than or equal to 8%.

* * * * *